United States Patent [19]

Sakamoto et al.

[11] Patent Number: 5,022,870

[45] Date of Patent: Jun. 11, 1991

[54] RETAINER FOR CONNECTOR TERMINALS

[75] Inventors: Yukio Sakamoto; Iwao Fukutani; Toshio Hori, all of Nagaokakyo, Japan

[73] Assignee: Murata Manufacturing Co., Ltd., Kyoto, Japan

[21] Appl. No.: 485,086

[22] Filed: Feb. 26, 1990

[30] Foreign Application Priority Data

Feb. 28, 1989 [JP] Japan .................................. 1-49690
May 30, 1989 [JP] Japan ................................. 1-139643

[51] Int. Cl.⁵ .......................................... H01R 13/648
[52] U.S. Cl. ..................................... 439/608; 439/751
[58] Field of Search ............... 439/607, 608, 733, 751, 439/660, 692, 426, 276, 936

[56] References Cited

U.S. PATENT DOCUMENTS

| | | | |
|---|---|---|---|
| 1,933,592 | 11/1933 | Hubbell, Jr. | 439/599 |
| 2,820,088 | 1/1958 | Sperry | 174/153 G |
| 3,427,550 | 2/1969 | Helda et al. | 206/331 |
| 3,456,232 | 7/1969 | Dupre | 439/271 |
| 3,516,044 | 6/1970 | Barnes et al. | 339/65 |
| 4,407,552 | 10/1983 | Watanabe et al. | 439/608 |
| 4,606,598 | 8/1986 | Drzymkowski et al. | 439/608 |
| 4,629,269 | 12/1986 | Kailus | 339/59 M |
| 4,840,571 | 6/1989 | Minata et al. | 439/76 |

*Primary Examiner*—Joseph H. McGlynn
*Assistant Examiner*—Julie R. Daulton
*Attorney, Agent, or Firm*—Wenderoth, Lind & Ponack

[57] ABSTRACT

A retainer for insert-retaining a plurality of pin terminals includes a ferrite member having an aligned arrangement of through holes formed at insertion positions of the pin terminals and a resin member covering one surface of the ferrite member. The resin member also has an aligned arrangement of holes for receiving the pin terminals. The ferrite member functions as a filter element to reduce noise. Thin portions are formed along the inner circumferential surfaces of resin member defining the holes. The thin portions are deformed or fractured by the insertion of the pin terminals, and then each deformed or fractured portion is sandwiched between the inserted pin terminal and the inner circumferential surface to thereby elastically engage the pin terminal, resulting in the retainer being secured to the pin terminals in a manner which prevents the terminals from shifting in position.

14 Claims, 3 Drawing Sheets

RETAINER FOR CONNECTOR TERMINALS

BACKGROUND OF THE INVENTION

1. Field of the Invention

This invention relates to a retainer for use in retaining a plurality of pin terminals, secured to and disposed in line on a connector, at appointed intervals.

2. Description of the Related Art

A connector mounted on a printed substrate of electronic devices and the like has had a construction wherein merely a plurality of pin-like terminals 22 extend from a connector body 21, as shown in FIG. 8.

With such a connector, it is difficult to always maintain the pitches of the respective terminals 22 constant and so the installation thereof on the printed substrate is sometimes difficult. In addition, the terminals are fractured or deformed during transportation of the connector according to certain circumstances.

So, in order to solve such problems, the present applicant has already proposed a retainer capable of maintaining pitches of the pin terminals constant and of preventing the pin terminals from being deformed.

As shown in FIGS. 9 and 10, the retainer 23, made of synthetic resin, is provided with holes 24 for receiving pin terminals 22 of the connector, which holes are arranged to correspond to the arrangement of the terminals 22. The diameters of respective holes 24 are larger than an outside diameter of pin terminals over the entire axial length thereof. In addition, the retainer is provided with a thin film 25 which can be fractured by passing the pin terminal through the hole 24 covered by the thin film 25.

In the above-described retainer 23, upon inserting a pin terminal 22 of the connector into hole 24, the thin film 25 is fractured by the terminal 22 and the fractured portion is elastically engaged with outer circumferential surface of the inserted pin terminal 22 to thereby allow the terminal 22 to surely support the retainer 23, whereby the pitches of pin terminals 22 can be maintained constant and the terminals 22 are prevented from being deformed during transportation of the connector.

Conventionally, for coping with noise in electronic devices and the like, a construction has been adopted wherein, as shown in FIG. 11 which is an explanatory view illustrating an installation condition, a connector 21 is mounted at an appointed position on a printed-wiring substrate 20 and then a filter element 26 such as a three-terminal capacitor or bead inductor is disposed on signal lines (not shown) of said substrate 20. A plurality of rows of respective pin terminals 22, extending in a longitudinal direction (in the drawing, in a direction perpendicular to the sheet) of the connector 21 and disposed in line at appointed positions, are connected to the signal lines.

However, such a construction has posed a problem in that extra space for filter element 26 must be provided to the side of connector 21 and in that additional labor is required for incorporating the filter element.

Thus, providing the connector 21 internally with a filter element, such as a capacitor, has been proposed in order to avoid such a drawback. But the connector 21 having an internal filter element is very expensive and this construction has posed another problem of giving rise to a substantially high cost.

SUMMARY OF THE INVENTION

Hence, this invention is designed to solve the above-described problems by providing a retainer that is capable of easily and surely coping with noise in electronic devices without the need for disposing a separate filter element to the side of the connector mounted on the printed-wiring substrate.

In order to solve the problems described above, the retainer according to the present invention comprises a ferrite member having through holes formed therethrough at aligned positions corresponding to insertion positions of said pin terminals, and a resin member covering at least one surface of said ferrite member and in which an aligned arrangement of holes for receiving said pin terminals are provided. Along an inner circumferential surface of the resin member that defines the holes are formed thin portions whose deformed or fractured portions, formed by the insertion of pin terminals, are sandwiched between the resin member and pin terminals to thereby elastically engage the pin terminals.

According to the present invention described above, the retainer is constructed in such a way that a resin member covers the ferrite member designed to function as a filter element, whereby the conventional filter element arranged separately from the connector is done away with. Also owing to a deformation or fracture of the thin portion formed in the hole of the resin member, the pin terminal is pressed against the resin member to thereby closely secure the retainer and pin terminals to one another.

DETAILED DESCRIPTION OF THE PREFERRED EMBODIMENTS

Figure 1:
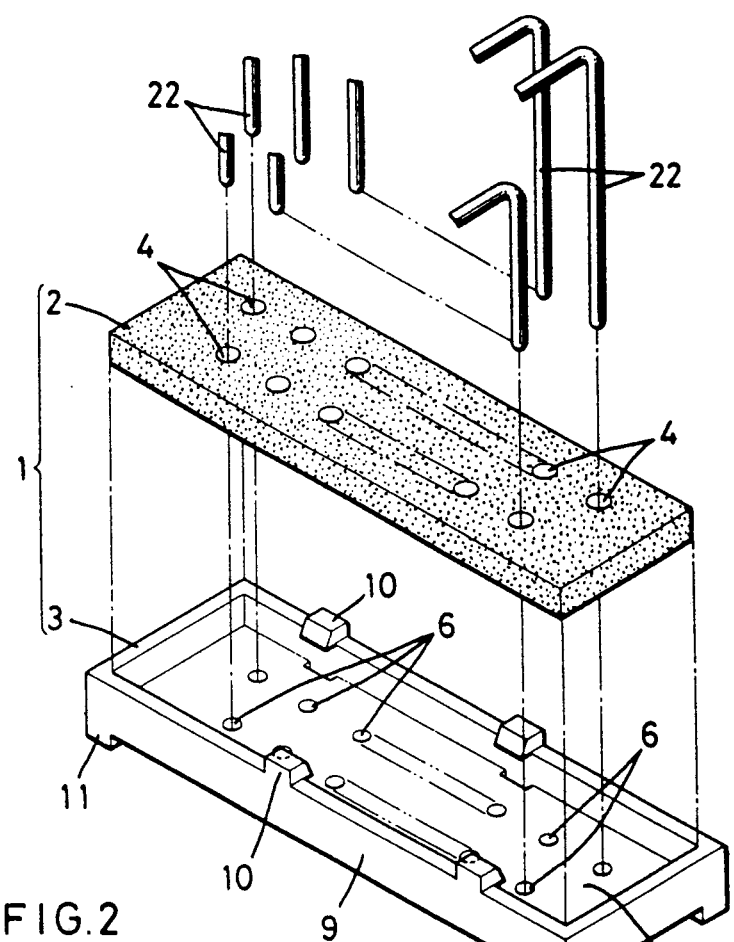
FIG. 1 is an exploded perspective view of the retainer for connector terminals according to the present invention.
Figure 2:
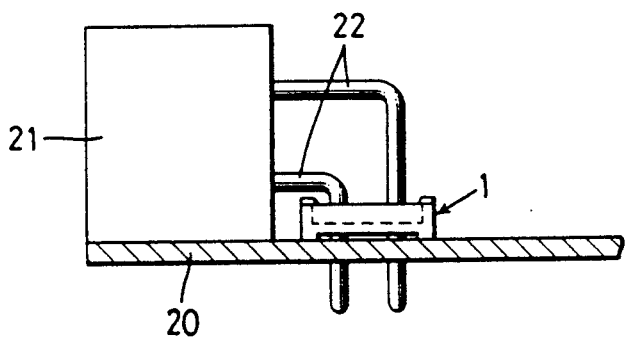
FIG. 2 is an explanatory view showing a connector and the retainer mounted on a printed substrate.
Figure 11:
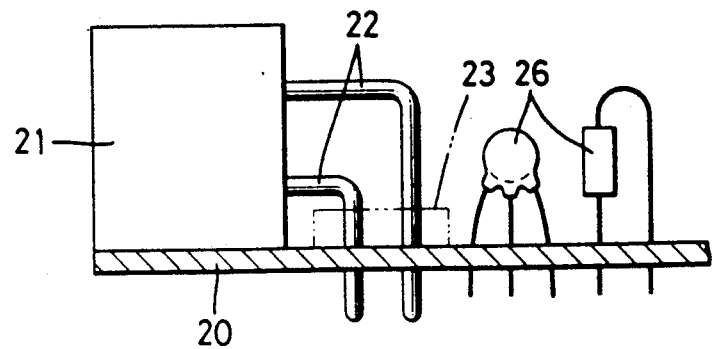
FIG. 11 is an explanatory view showing a connector mounted on a conventional printed substrate.

In FIGS. 1 and 2, reference numeral 1 designates the retainer for connector terminals. As is clearly shown in FIG. 2, retainer 1 is disposed at one side of connector 21 to retain the pin terminals 22 thereof and thereby keep them spaced from each other. In addition, in FIG. 2, the same parts or portions to those in FIG. 11 are designated by the same reference numerals and a detailed explanation thereof is omitted here.

The retainer 1 according to the present invention is constructed of ferrite member 2 functioning as a filter element and of an insulating resin member 3 retaining said ferrite member inside thereof. The ferrite member 2 has a flat and rectangular shape of an appointed thickness, and defines at respective inserting positions associated with pin terminals 22 a plurality of lines of through-holes 4, each of which has a circular or square cross section corresponding to that of the terminals 22.

On the other hand, the resin member 3, formed as an insulating case to retain the ferrite member 2 inside thereof, defines at the bottom 5 thereof lines of holes 6 for retaining respective pin terminals 22. One surface (under surface, in the drawing) of ferrite member 2 covers the bottom 5 of resin member 3. The holes 6 also have a circular or square cross section corresponding to that of pin terminals 22.

Figure 3:
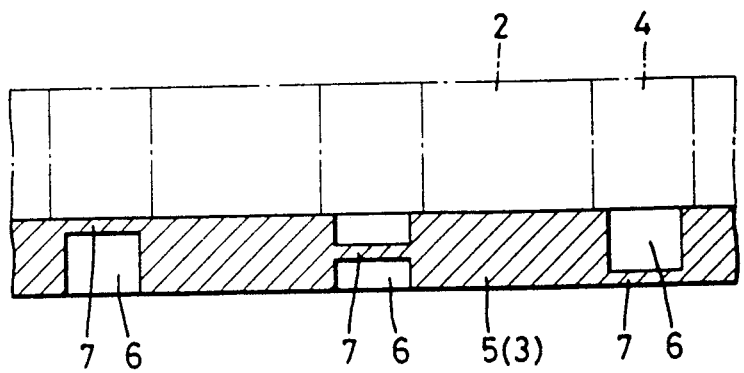
FIG. 3 is an enlarged sectional view of an essential part of a first example of the retainer.

The diameter of each hole 6 in the above-described resin member 3 is smaller than that of through-hole 4 in ferrite member 2, as shown in FIG. 3, whereby each pin terminal 22 can be smoothly inserted into a respective hole 6.

Figure 4:
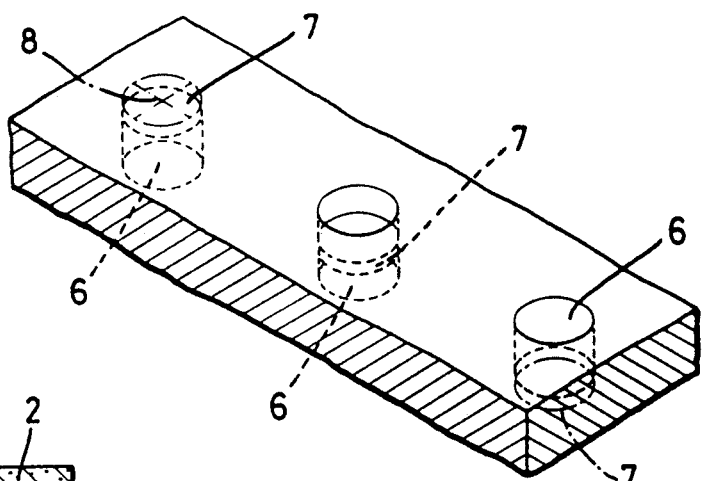
FIG. 4 is an external perspective view of the essential part of the retainer shown in FIG. 3.

In the first example of resin member 3 shown in FIGS. 3 and 4, a thin film portion 7 covers some of the holes 6 and is designed to be fractured by the insertion of pin terminal 22.

In the drawings, each thin film portion is formed at a level different from the thin film portion adjacent thereto along a longitudinal direction of the line of holes 6 such that pin terminals 22, having pointed ends thereof lying substantially in a common plane, can easily and smoothly be inserted into resin member 3. However, these thin portions 7 can be formed at the same level according to the present invention. In addition, it is not necessary to cover all of the holes 6 within a thin film portion 7; rather, only appointed holes 6 need be covered. Furthermore, needless to say, each thin portion 7 is easily fractured when a slit 8 is formed beforehand as shown by a chain line in FIG. 4.

Figure 5:
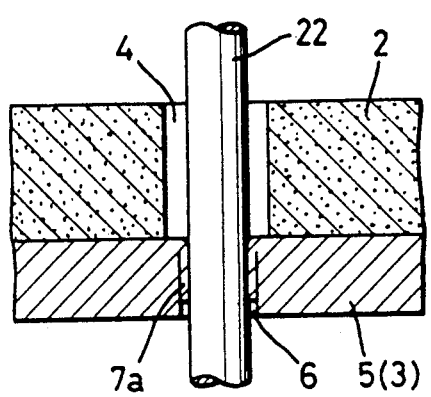
FIG. 5 is an explanatory view showing how respective parts are secured to one another.

Thus, when a pin terminal 22 is inserted into a hole 6 defined by resin member 3, its pointed end engages the thin portion 7 covering the hole 6 and then breaks it. The fractured portion 7a of thin film portion 7 obtained by the insertion of pin terminal 22 is sandwiched between the portion of resin member 3 defining hole 6 and terminal 22 as shown in FIG. 5 with the result that pin terminal 22 having passed through hole 6 is elastically pressed by fractured portion 7a to thereby be mechanically secured to resin member 3.

At appointed positions along edges (in the drawing, the upper edges) of the sidewalls 9, the resin member 3 has pawls 10 that abut against a surface (in the drawing, the upper surface) of the ferrite member 2 retained inside of the resin member 3. So, ferrite member 2 inside of resin member 3 is positioned to some extent by these pawls 10, thereby preventing the ferrite member 2 from shaking. The projecting portions 11 of resin member 3, provided at the four corners of the underside thereof, are designed to separate retainer 1 from the surface of printed-wiring substrate 20.

In the explanation above, ferrite member 2 is described as being disposed inside of resin member 3 formed as a case; however, resin member 3 need not always be formed as a case. In other words, resin member 3 has only to cover at least one surface of ferrite member 2. On such an occasion, for example, ferrite member 2 and resin member 3 may be secured by adhesives. Moreover, needless to say, the positions of ferrite member 2 and resin member 3 may be inverted from those of FIG. 1.

Figure 6:
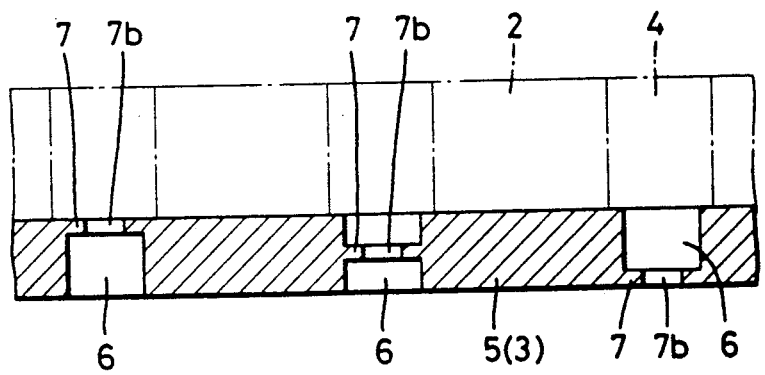
FIG. 6 is an enlarged sectional view of an essential part of a second example of the retainer.
Figure 7:
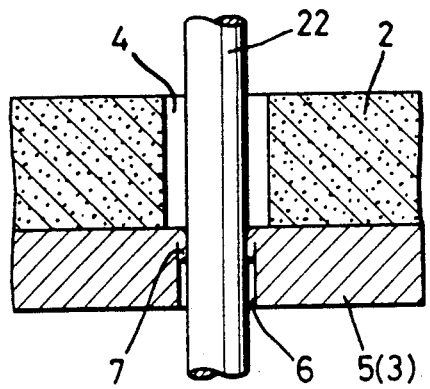
FIG. 7 is an explanatory view showing how respective parts in the retainer of FIG. 6 are secured to one another.
Figure 8:
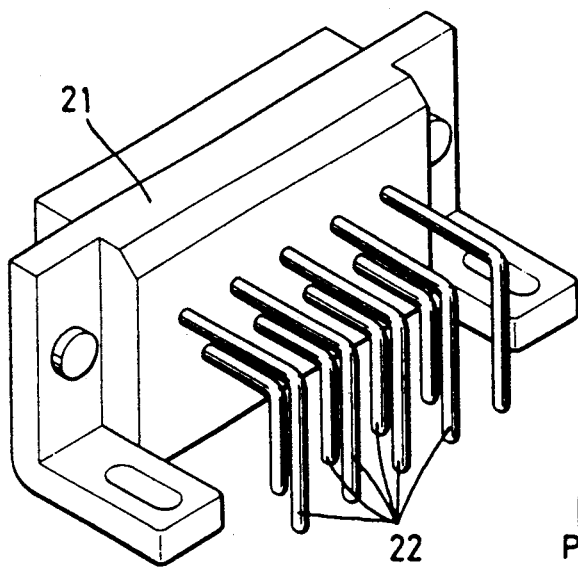
FIG. 8 is a perspective view of a conventional connector.
Figure 9:
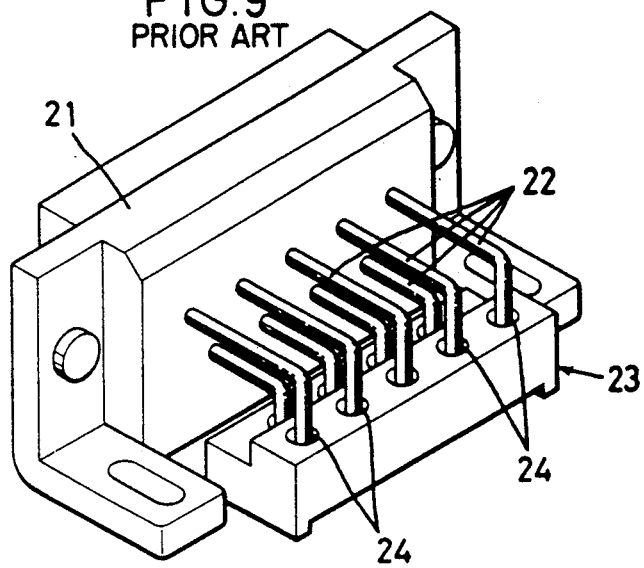
FIG. 9 is a perspective view of a conventional retainer in use.
Figure 10:
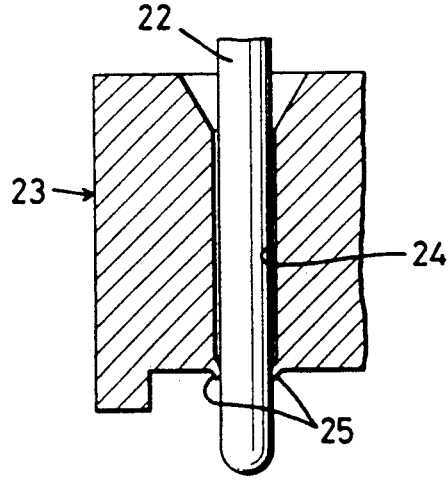
FIG. 10 is an enlarged sectional view of an essential part of the conventional retainer showing a retainer in use.

Next, the second example of resin member 3 shown in FIGS. 6 and 7 will be described.

The same parts as those in the first example described above are designated by the same reference numerals and a detailed description thereof is omitted.

In the second example, as a means to secure the retainer to pin terminals 22, a thin portion 7, which is thin enough to be easily deformed by the insertion of pin terminal 22 into hole 6, is formed annularly along the inner circumferential surface of resin member 3 that defines hole 6.

Upon the insertion of pin terminal 22 into hole 6 of resin member 3, the pointed end thereof engages thin film portion 7 formed along the inside of hole 6 to thereby force open opening 7b and pass therethrough. Then the deformed thin portion 7 elastically presses the outer circumferential surface of pin terminal 22, with a result that pin terminal 22 and resin member 3 are mechanically secured to each other as shown in the enlarged view of FIG. 7.

When thin portion 7 is annularly formed as shown in the second example, a reduced resistance is generated at the time of insertion of pin terminal 22 owing to opening 7b, thus ensuring a smooth insertion of pin terminal 22.

As described above, the retainer according to the present invention is constructed of a ferrite member functioning as a filter element and of a resin member covering said ferrite member to thereby obviate the necessity of separately installing the conventional filter element to the side of the connector to which the retainer is fixed, and moreover, to thereby eliminate both the space and necessary mounting work associated with the conventional separate filter element. Thus, the noise problems with electronic devices can easily and surely be coped with.

Besides, since holes are provided in the resin member covering the ferrite member, and thin portions are formed along inner circumferential surfaces of the resin member, the insertion of the pin terminals causes the thin portions to be deformed or fractured to thereby elastically engage the pin terminals resulting in the retainer being closely secured to the pin terminals with an attendant effect of preventing the pin terminals from shifting in position.

What is claimed is:

1. A retainer for insert-retaining a plurality of pin terminals of an electrical connector, said retainer comprising: a rectangular ferrite member having opposed surfaces and an aligned arrangement of a plurality of through-holes extending therethrough between said surfaces; and a resin member covering at least one of said surfaces, said resin member having an aligned arrangement of a plurality of terminal-receiving through-holes extending therethrough and located over the through-holes of said ferrite member, respectively, and said resin member having respective thin portions extending along inner circumferential surfaces thereof that define respective ones of said terminal-receiving through-holes, said thin portions having a thickness that allows the thin portions to be deformed or fractured when pin terminals of an electrical connector are inserted through the respective ones of the terminal-receiving through-holes, said resin member having a portion thereof of a rectangular shape corresponding to the rectangular shape of said ferrite member, said portion of the resin member covering one of the surfaces of said resin member, and said resin member having a plurality of side-walls extending from said portion thereof and confronting side edges of the rectangular ferrite member.

2. A retainer as claimed in claim 1, wherein said thin portions completely block said respective ones of the terminal-receiving through-holes.

3. A retainer as claimed in claim 1, wherein said thin portions are annular and define respective openings through the centers thereof.

4. A retainer as claimed in claim 1, wherein the terminal-receiving through-holes of said resin member have diameters that are respectively smaller than those of the through-holes of said ferrite member over which the terminal-receiving through-holes are located.

5. A retainer as claimed in claim 1, wherein the thin portions are located at different depths from one another within the terminal-receiving through-holes of said resin member.

6. A retainer as claimed in claim 1, wherein said ferrite member and said resin member each have a rectangular shape, and are secured to one another at confronting surfaces thereof by adhesive.

7. A retainer as claimed in claim 1, wherein said resin member further includes a plurality of pawls extending from said sidewalls thereof and securing said ferrite member to said resin member.

8. A retainer as claimed in claim 7, wherein said resin member further includes projecting members respectively extending from four corners of a surface of said portion thereof that is opposite the surface from which said sidewalls extend.

9. The combination of an electrical connector having a plurality of spaced pin terminals arranged in at least one row, and a retainer for maintaining the spacing between said terminals and for filtering noise in electric signals transmitted through said connector by said pin terminals,
said retainer comprising a rectangular ferrite member having opposed surfaces and an aligned arrangement of a plurality of through-holes extending therethrough between said surfaces at positions spaced apart by intervals corresponding to said spacing, and a resin member having an aligned arrangement of a plurality of terminal-receiving through-holes extending therethrough and located over the through-holes of said ferrite member, respectively.
said resin member also having deformed or fractured thin portions extending along inner circumferential surfaces thereof that define respective ones of said terminal-receiving through-holes,
said pin terminals extending through the through-holes of said ferrite member and the terminal-receiving through-holes of said resin member, and
said thin portions sandwiched between respective ones of said pin terminals and said inner circumferential surfaces of said resin member, and respectively elastically engaging said respective ones of said pin terminals to secure said retainer to said electrical connector, and
said resin member having a portion thereof of a rectangular shape corresponding to the rectangular shape of said ferrite member, said portion of the resin member covering one of the surfaces of said resin member, and said resin member having a plurality of sidewalls extending from said portion thereof and confronting side edges of the rectangular ferrite member.

10. A retainer as claimed in claim 9, wherein the terminal-receiving through-holes of said resin member have diameters that are respectively smaller than those of the through-holes of said ferrite member over which the terminal-receiving through-holes are located.

11. A retainer as claimed in claim 9, wherein the thin portions are located at different depths from one another within the terminal-receiving through-holes of said resin member.

12. A retainer as claimed in claim 9, wherein said ferrite member and said resin member each have a rectangular shape, and are secured to one another at confronting surfaces thereof by adhesive.

13. A retainer as claimed in claim 9, wherein said resin member further includes a plurality of pawls extending from said sidewalls thereof and securing said ferrite member to said resin member.

14. A retainer as claimed in claim 13, wherein said resin member further includes projecting members respectively extending from four corners of a surface of said portion thereof that is opposite the surface from which said sidewalls extend.

* * * * *